(12) United States Patent
Crawford

(10) Patent No.: US 6,646,479 B1
(45) Date of Patent: Nov. 11, 2003

(54) PULSE DISCRIMINATOR

(75) Inventor: Ian D. Crawford, Longwood, FL (US)

(73) Assignee: Analog Modules Inc., Longwood, FL (US)

( * ) Notice: Subject to any disclaimer, the term of this patent is extended or adjusted under 35 U.S.C. 154(b) by 0 days.

(21) Appl. No.: 10/287,665

(22) Filed: Nov. 4, 2002

(51) Int. Cl.[7] ............................................. H03K 5/153
(52) U.S. Cl. ........................................ 327/72; 327/68
(58) Field of Search ............................. 327/72, 73, 77, 327/68, 69, 70, 18, 20, 21, 58–62, 96, 307, 362, 78, 79

(56) References Cited

U.S. PATENT DOCUMENTS

| | | | | |
|---|---|---|---|---|
| 4,677,388 A | * | 6/1987 | Morrison ...................... | 327/78 |
| 4,821,292 A | * | 4/1989 | Childress ...................... | 327/73 |
| 4,910,753 A | * | 3/1990 | Wakatsuki et al. ............ | 327/72 |
| 4,943,745 A | * | 7/1990 | Watanabe et al. ........... | 327/262 |
| 6,225,835 B1 | * | 5/2001 | Ohkubo ........................ | 327/77 |
| 6,384,640 B1 | * | 5/2002 | Du Bois et al. ............... | 327/72 |

* cited by examiner

*Primary Examiner*—Toan Tran
(74) *Attorney, Agent, or Firm*—Gerald E. Linden

(57) ABSTRACT

A non-delayed input signal is provided to a first comparator input and, a delayed input signal is applied to a second comparator input. An offset voltage is applied between the delayed and non-delayed signals at the comparator inputs. When an input pulse appears on the input signal, the non-delayed input signal will rise immediately and maintain itself more positive than the delayed input, keeping the comparator output inactive. As long as the input signal is rising, the comparator output is maintained low, or inactive. When the non-delayed signal reaches its peak and turns downward, the delayed input signal is still rising and crosses over the first pulse, creating a change of state at the comparator output to a high or active state. The signal edge resulting from this change of start represents initial detection of an input pulse. The time of occurrence of this detection edge is substantially independent of the pulse amplitude. To extend the dynamic range of the pulse discriminator, multiple channels, each implemented to handle a distinct range of signal levels, may be included, and combined at their outputs. To improve accuracy for very low-level signals, and to reduce the incidence of false alarms, a separate detection threshold can be used to gate the comparator.

19 Claims, 6 Drawing Sheets

PULSE DISCRIMINATOR

TECHNICAL FIELD OF THE INVENTION

The invention relates to detecting pulses, such as with laser rangefinder receivers and, more particularly, to measuring thresholds of return pulses with a pulse discriminator (PD).

BACKGROUND OF THE INVENTION

In laser rangefinder systems, the distance to a target is determined by measuring the time interval between when a transmitted pulse is produced by a laser pulse source and when its reflection (return pulse) from a target is detected. Usually, a digital range counter is started at the time $t_0$ when the transmitted pulse is detected and stopped at the time $t_r$ when the returned pulse is detected. The pulses are normally detected by means of a photodetector, producing corresponding analog signals representative thereof. These analog signals are then processed electronically to generate command signals to start and stop the digital range counter. The resultant time interval measurement ($t_r$–$t_0$) is indicative of the distance between the laser pulse source and the target.

Due to the shape of the analog signal produced by a laser pulse impinging upon a photodetector (often Gaussian) and finite receiver bandwidth, the pulse's leading edge exhibits a risetime. If a fixed-threshold comparator were used to detect and separate the pulses from (lower amplitude) noise signals, the actual time at which the return pulse crossed the comparator threshold would be a function of the amplitude of the pulse signal. This would introduce considerable error and uncertainty into laser rangefinder distance measurement.

The effect of a fixed-threshold comparator on the accuracy of range measurement can be illustrated by considering its response to two different return pulses of differing amplitude: a strong return pulse and a weak return pulse. The strong return pulse signal would result in a threshold crossing at a relatively low point (early) along its leading edge, resulting in an relatively early counter stop command, thereby producing a time interval measurement indicative of a relatively shorter distance between the pulse source and the target (range to target). Conversely, a relatively low-amplitude return pulse signal that just barely crosses the comparator threshold would result in a threshold crossing very high (late) on its rising edge, producing a relatively later counter stop command, thereby producing a time interval measurement indicative of a relatively longer range to target than would be produced by a stronger return pulse occurring at the same time.

To overcome the amplitude sensitivity of a fixed-threshold comparator, a type of pulse discriminator (PD) known as a constant fraction discriminator (CFD), has been developed to help ensure that the time at which a pulse's threshold crossing is detected is substantially independent of pulse amplitude. By using the same CFD circuit to detect both the transmitted pulse and the return pulse (thereby producing both the start and stop commands to the digital range counter), the time interval measurement ($t_r$–$t_0$) is substantially unaffected by any delay in the CFD or amplitude variations in the start or stop pulses.

A CFD operates by monitoring the amplitude of the incoming signal (pulse) and continually adjusting its detection threshold to a fixed (i.e., constant) fraction thereof. This threshold level may be produced by attenuating the incoming signal by a fixed attenuation factor and "stretching" the peak of the attenuated signal (e.g., via a peak-hold or "pulse-stretching" circuit). This threshold level is then compared to a delayed version of the incoming signal (e.g., by subtracting it threshold level and detecting zero crossings). The amount by which the incoming signal is delayed is selected to allow sufficient time for the attenuation and peak "stretching" circuit to "set up" a valid and stable threshold level. This approach is substantially,independent of pulse shape.

Simpler CFDs do not employ the "pulse-stretching" aspect of the CFD described above. An example of such a simpler CFD is shown in FIG. 1.

FIG. 1 shows a simple prior-art CFD 100 wherein an input signal 102 is applied to a fixed attenuator 104 and a delay line 108. The attenuator 104 scales down the input signal 102 by a fixed attenuation constant "K" to produce an attenuated input signal 106. The delay line 108 delays the input signal 102 by a fixed amount, producing a delay signal 110. The delay signal 110 is inverted (multiplied by −1) by an inverter 112, to produce an inverted, delayed signal 114. A summing block 116 adds the attenuated input signal 106 to the inverted, delayed signal 114 to produce a summation signal 118. A comparator 120 compares the summation signal 118 to a "zero" level to produce a positive output 122 ("OUT") whenever the summation signal is greater than the zero level.

In effect, the CFD of FIG. 1 uses the attenuated input signal 106 as a comparison threshold against which the delayed input signal 110 is compared. The delay is selected to produce the desired threshold crossing point. (In using this technique, it is desired that the shape of the input pulse is constant.)

Another commonly used prior-art pulse detection technique is to differentiate input pulses from a baseline noise level by considering only input signals above a predetermined minimum noise-rejection threshold (effectively a "squelch" level). The "squelched" input signal is then differentiated. Due to the natural properties of differentiation, with the correct differentiation time-constant, the differentiated input signal will cross zero at a point corresponding to the peak of the input pulse. Pulse symmetry between rising and falling edges is desirable for an accurate zero crossing time.

Some of the disadvantages of these prior art techniques are:

a) They are complex, especially when multiple channels are used to extend the dynamic range of the CFD or to allow the use of detector arrays.

b) When multiple return pulses are close together, (e.g., as a result of a target behind a tree, with a signal from both the tree and the target) the second return may interfere with the delayed first return, causing a range error or lack of target discrimination, (i.e., the inability to separate and distinguish between the two return pulses). This is especially problematic when the first return pulse is stronger, or when the trailing edge of the first return pulse is elongated (e.g., due to a sloping first target), or distributed in range (e.g., due to multiple closely-spaced echoes from the leaves of a tree).

c) The simpler techniques are sensitive to the pulse shape.

BRIEF DESCRIPTION (SUMMARY) OF THE INVENTION

It is a general object of the present invention to provide an improved technique for discriminating between return pulses and improving range accuracy.

It is a further object of the invention to provide a simpler, less-expensive, lower-power pulse discriminator (PD), suitable for use in arrays and expanded dynamic range requirements.

It is a further object of the invention to provide a PD that will allow the resolution of closely spaced pulses, even when a subsequent pulse is small enough that it only appears as a modulation on the trailing edge of a first pulse.

It is a further object of the invention to provide a PD that is easily expandable in dynamic range.

It is a further object of the invention to provide a technique for ensuring an accurate measurement of pulse timing over a wide dynamic range, or in the presence of multiple pulses.

According to the invention, a non-delayed input signal is provided to a first comparator input and a delayed input signal (the delay is applied by a delay line or equivalent delay circuit) is applied to a second comparator input. An offset voltage is applied between the delayed and non-delayed signals at the comparator inputs to provide a "bias" so that the output of the comparator is "normally" (when no signal is present) at an "inactive" state. Typically, the comparator will be a "fast" comparator, suited to comparing high-speed analog signals. The comparator compares the delayed and non-delayed signals by effectively subtracting them from one another (with offset applied) and, by greatly amplifying the result to the point of amplifier saturation, effectively producing a logic signal output. Assuming positive signal sense (pulse input is positive going) and that the non-delayed input signal is connected to an inverting input of the comparator, the output of the comparator will "normally" be "low" or inactive. When an input pulse appears on the input signal, the non-delayed input signal will rise immediately and maintain itself more positive than the delayed input, keeping the comparator output "inactive". As long as the input signal is rising (on the leading edge of the input pulse), the comparator output is maintained "low" or inactive. When the non-delayed signal reaches its peak and turns downward, the delayed input signal is still rising and crosses over the first pulse, creating a change of state at the comparator output to a "high" or active state. The signal edge resulting from this change of start represents initial detection of an input pulse and is used to start or stop a digital range counter. The time of occurrence of this detection edge is substantially independent of the pulse amplitude. In the event that there is a smaller pulse on the "tail" of an input pulse, then a crossover may recur again in a similar manner to mark the presence and timing of the third pulse.

According to an embodiment of the invention, a pulse discriminator has an input and an output, and comprises: a first delay line (DL1), a first resistor (R4), a first capacitor (C1), a first adjustable current source (G1), and a first comparator (A2) having two inputs and an output wherein, an input signal (IN) is provided to the input of the first delay line, the output of the first delay line is connected to a first input of the first comparator, the first resistor is connected in parallel across the first capacitor, and is connected between the input of the first delay line and a second input of the first comparator, the adjustable current source is connected to the second input of the first comparator, and the output of the first comparator is the output of the pulse discriminator.

Many signals have a fast rise time and a slower fall time, for example, due to minority carrier diffusion in a photodetector, or decays in the measured event. The present invention is useful for detecting and separating pulses even when these pulses are so closely spaced that their waveforms overlap somewhat.

The dynamic range of the pulse discriminator is limited at the high end by the practical voltage limitations of the fast components needed, and by the offset and noise errors at low signal levels. In order to provide a pulse discriminator with wider dynamic range, additional, parallel pulse discriminators (PDs) of the same type (i.e., delay line, offset, comparator) can be employed, each one adapted to handle a specific range of signal levels. The simple PD circuit of the present invention is readily duplicated and adapted to different signal levels by preceding it with a suitable buffer amplifier or attenuator to scale the input signal up or down. The outputs each of the separate, parallel PD sections for the different ranges are combined with a conventional OR circuit to give a single edge with minimum error over a wide dynamic range.

At low signal levels, it is desirable to prevent noise or offsets from generating an output. This may be accomplished by using a gated comparator in the PD circuit, with a separate low-level threshold detector to generate a gating signal to enable the comparators only for signals above a threshold level, thereby effectively "squelching" signals below the threshold level. An alternative approach is to add a threshold in series with the delayed signal so that for low levels there is an additional separation between the first pulse and the second pulse prior to a crossing. This latter approach would make the PD more sensitive to pulse shape, but virtually every discriminator is subject to increased errors at very low signal levels in the presence of noise.

There is thus provided various methods and means for detecting signals such as return pulses in a laser rangefinder receiver.

Other objects, features and advantages of the invention will become apparent in light of the following description thereof.

BRIEF DESCRIPTION OF THE DRAWINGS

Reference will be made in detail to preferred embodiments of the invention, examples of which are illustrated in the accompanying drawings. The drawings are intended to be illustrative, not limiting. Although the invention will be described in the context of these preferred embodiments, it should be understood that it is not intended to limit the spirit and scope of the invention to these particular embodiments.

Often, similar elements throughout the drawings may be referred to by similar references numerals. For example, the element 199 in a figure (or embodiment) may be similar or analogous in many respects to an element 199A in another figure (or embodiment). Such a relationship, if any, between similar elements in different figures or embodiments will become apparent throughout the specification, including, if applicable, in the claims and abstract. In some cases, similar elements may be referred to with similar numbers in a single drawing. For example, a plurality of elements 199 may be referred to as 199A, 199B, 199B, etc.

Figure 1:
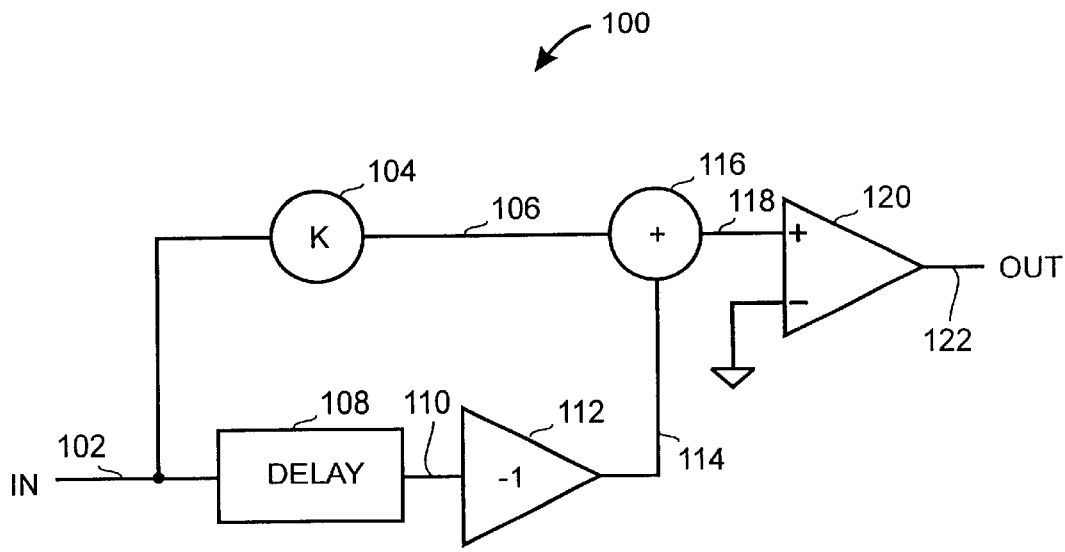

Conventional electronic components may be labeled with conventional schematic-style references comprising a letter (e.g., A, C, R) indicating the type of electronic component (e.g., amplifier, capacitor, resistor, respectively) followed by a number indicating the iteration of that element (e.g., "1" meaning a first of typically several of a given type of electronic component). Components such as resistors and capacitors typically have two terminals, which may be referred to herein as "ends". In some instances, "signals" are referred to, and reference numerals point to lines which carry said signals.

The structure, operation, and advantages of the present preferred embodiment of the invention will become further apparent upon consideration of the following description taken in conjunction with the accompanying drawings.

FIG. 1 is a schematic diagram of a constant fraction discriminator (CFD), according to the prior art.

Figure 2:
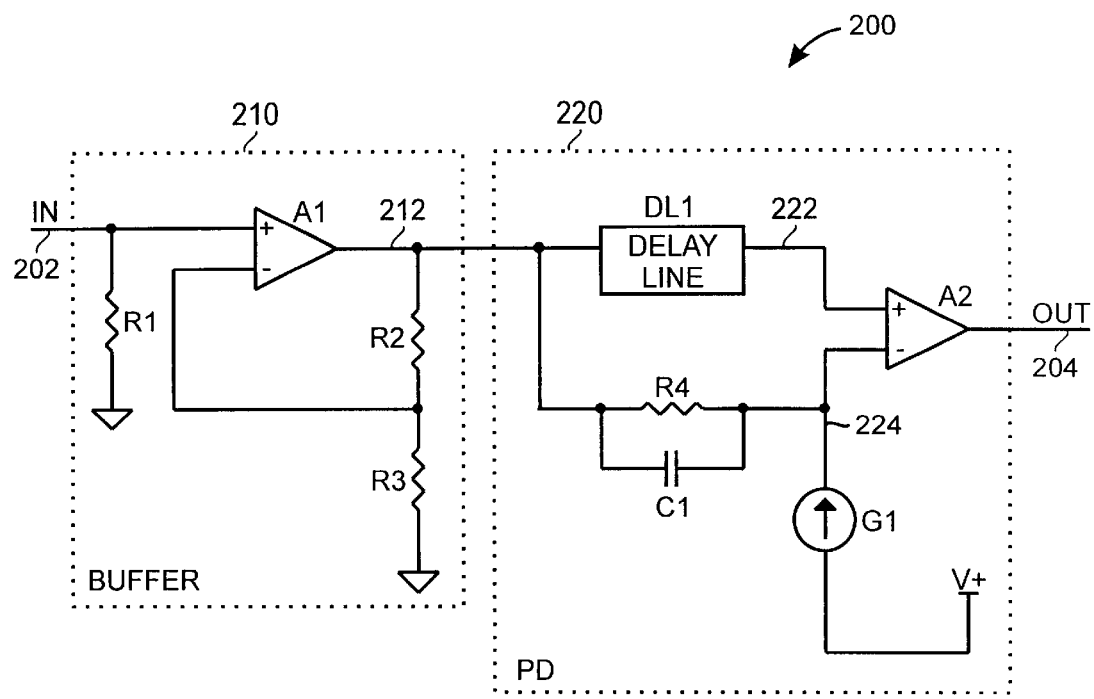

FIG. 2 is a schematic diagram of an embodiment of a single channel pulse discriminator (PD), according to the invention.

Figure 2A:
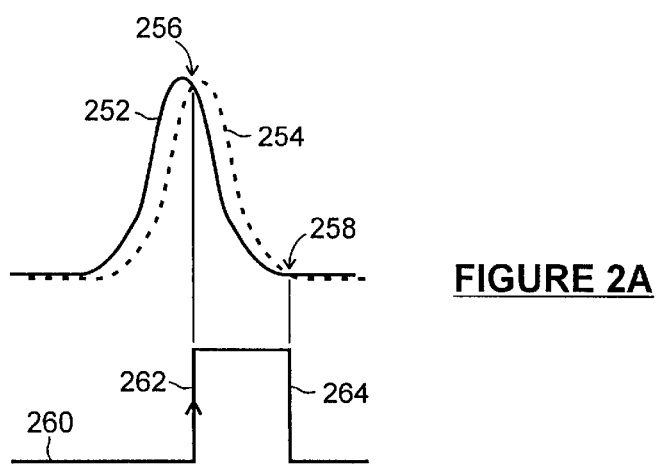

FIG. 2A is a waveform (timing) diagram illustrating the illustrating the relationship of signals in the single channel PD of FIG. 2

Figure 3:
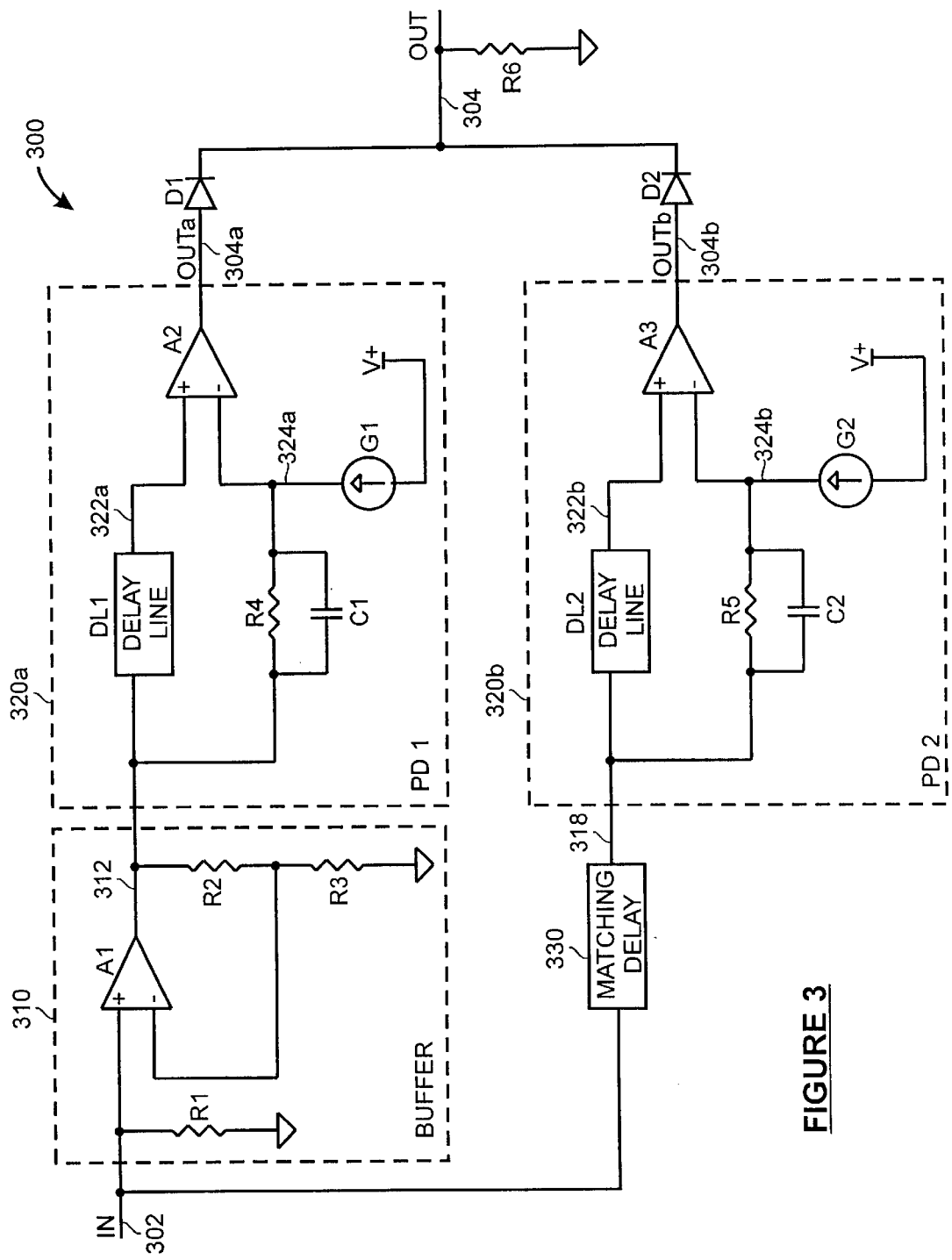

FIG. 3 is a schematic diagram of an embodiment of a multiple channel pulse discriminator (PD) with extended dynamic range, according to the invention.

Figure 3A:
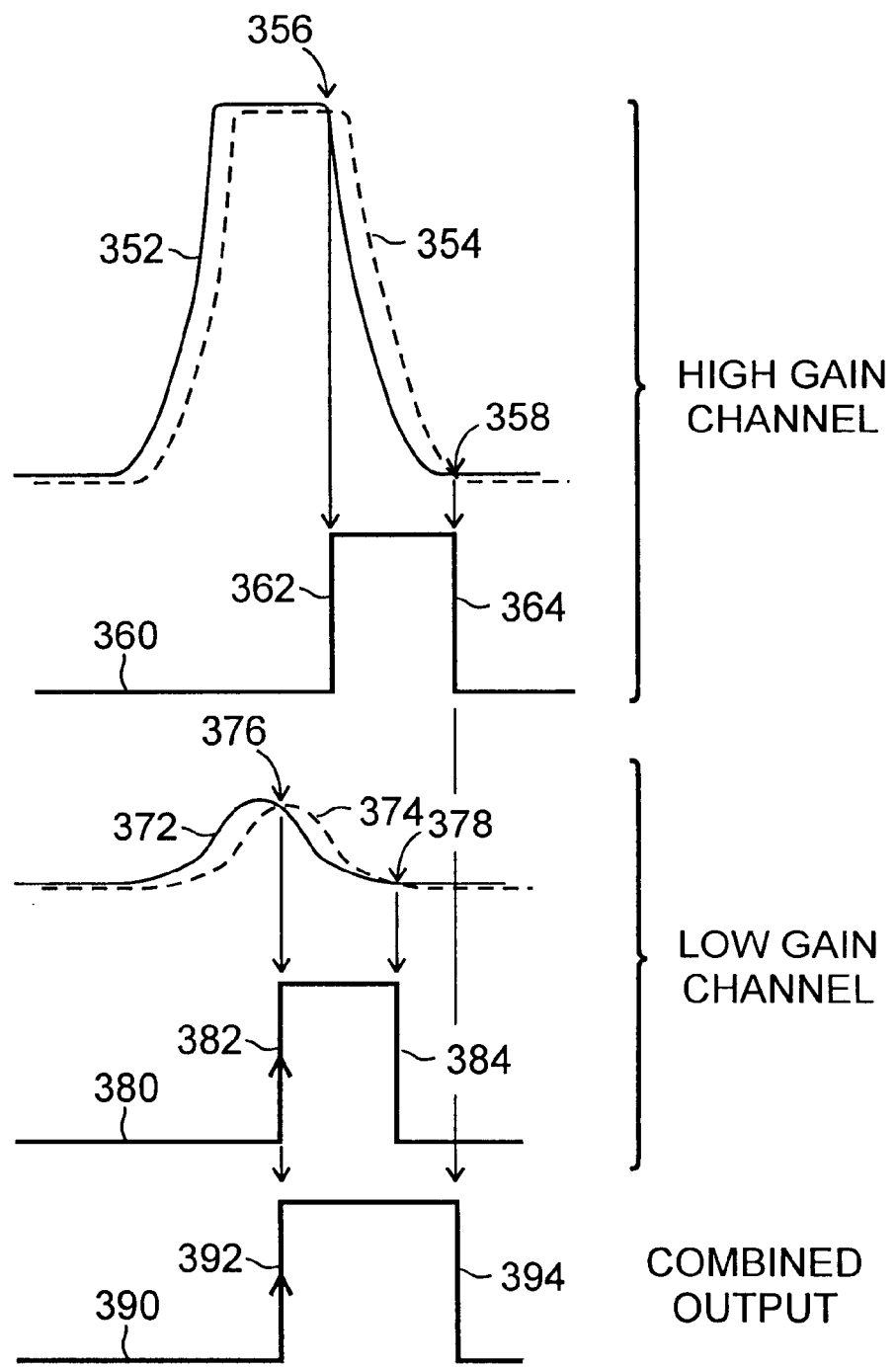

FIG. 3A is a waveform (timing) diagram illustrating the behavior of a multi-channel PD to a strong input signal, such as would be evident in the embodiment of FIG. 3.

Figure 4:
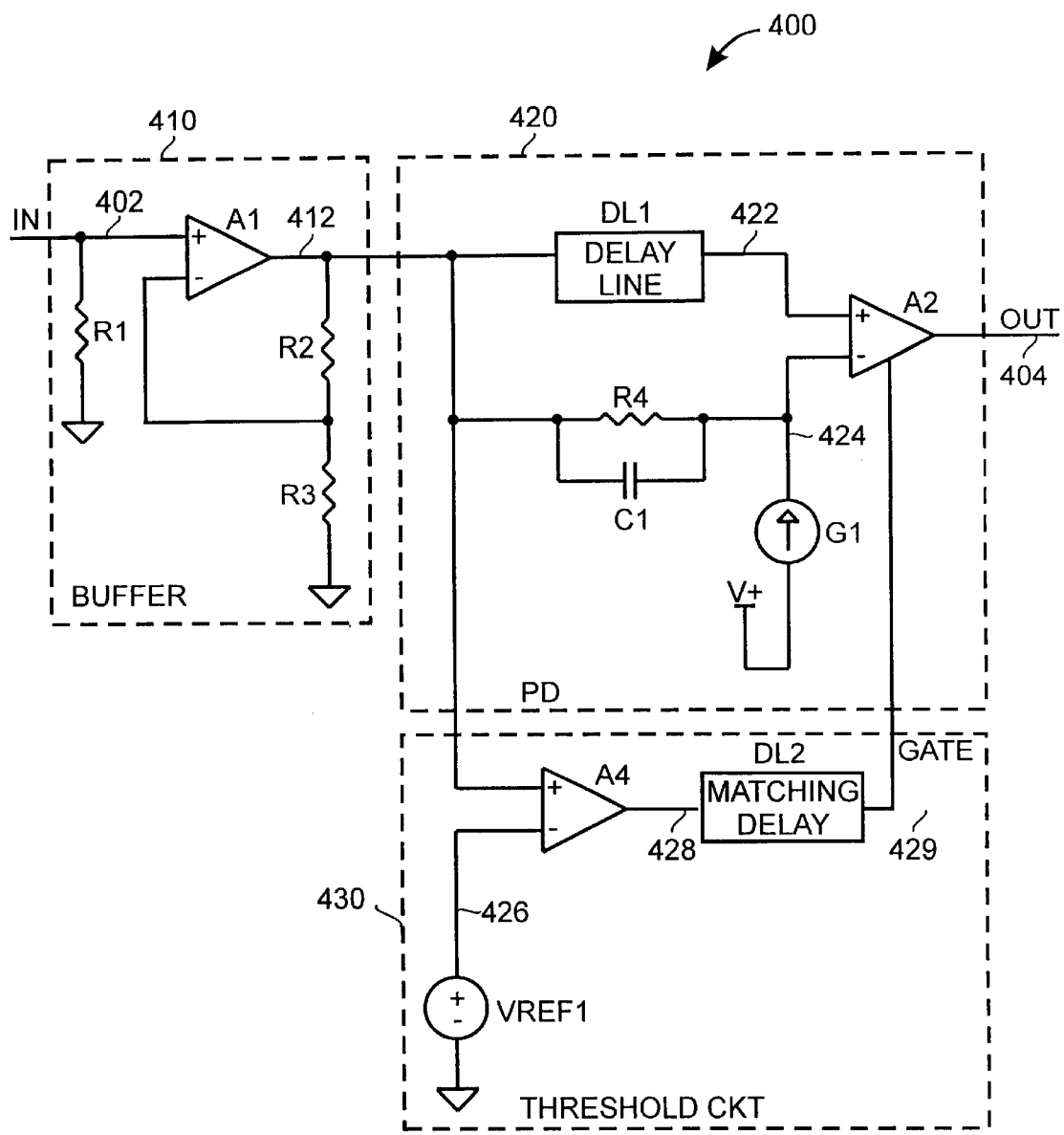

FIG. 4 is a schematic diagram of a single channel pulse discriminator (PD) with a signal detection comparator gating the delayed signal, according to the invention.

Figure 4A:
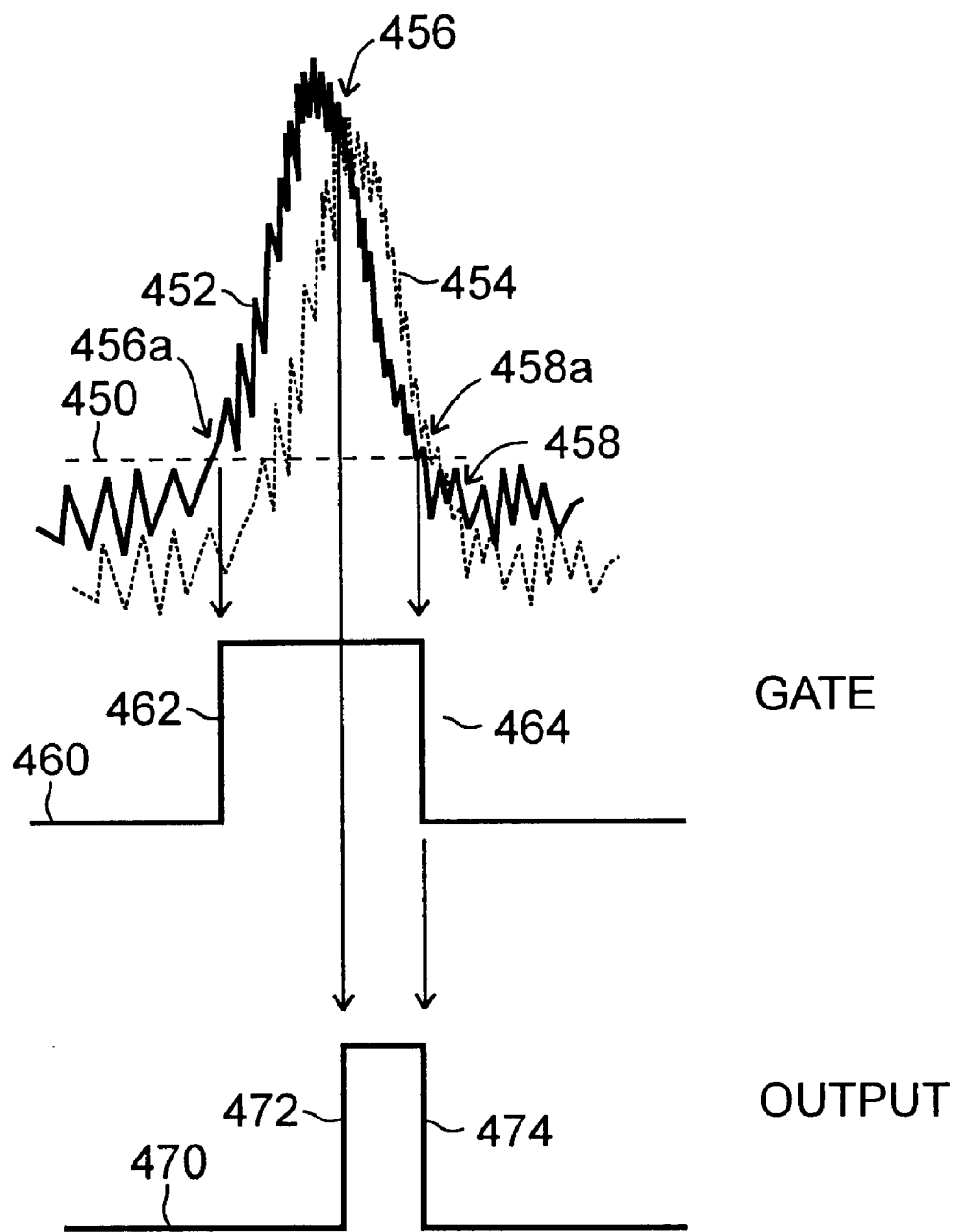

FIG. 4A is a waveform (timing) diagram illustrating the relationship between a return pulse and an output pulse in a single channel PD with gating, such as would be evident in the embodiment of FIG. 4.

Figure 5:
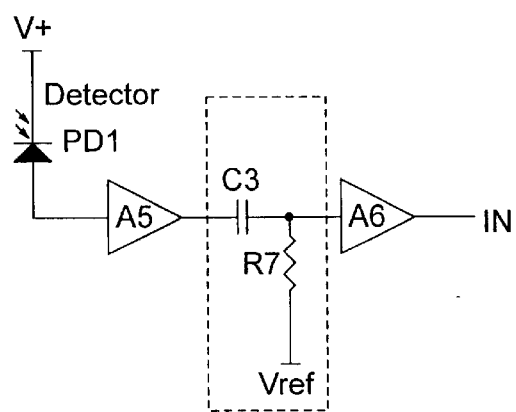

FIG. 5 is a schematic of a portion of a laser rangefinder receiver producing a signal ("IN") for pulse detection by the present invention.

DETAILED DESCRIPTION OF THE INVENTION

FIG. 2 illustrates an embodiment of a single channel pulse discriminator circuit 200 comprising a buffer section 210 and a pulse discriminator section 220 (PD). The buffer section 210 receives a "raw" input signal 202 ("IN") and produces a "buffered" (or scaled) input signal 212. The PD section 220 receives the buffered input signal 212 and produces an output signal 204 ("OUT"). The buffer section 210 comprises a buffer amplifier A1 and three resistors R1, R2 and R3. The buffer amplifier A1 has a non-inverting input (+), an inverting input (−) and an output. The input signal 202 connects to the non-inverting input (+) of the buffer amplifier A1. The resistor R1 is connected between the non-inverting input of the buffer amplifier A1 and ground. The resistor R2 is connected between the output and the inverting input (−) of the buffer amplifier A1, and the resistor R3 is connected between the inverting input (−) of the buffer amplifier A1 and ground. The gain of the buffer amplifier A1 is set by the values of resistors R2 and R3. The output of buffer amplifier A1 is the buffered input signal 212.

The pulse discriminator (PD) section comprises a delay line DL1, a comparator A2, a resistor R4, a capacitor C1 and a current source G1. The comparator A2 has a non-inverting input (+), an inverting input (−) and an output. The delay line DL1 has an input connected to the buffered input signal 212 and an output connected to the non-inverting input (+) of the comparator A2. The input signal 212 is also connected to a first end of the resistor R4 and a first end of the capacitor C1. A second end of the resistor R4 is connected to a second end of the capacitor C1, to the current source G1, and to the inverting input (−) of the comparator A2. The resistor R4 and the capacitor C1 are connected in parallel with one another. The comparator A2 is preferably a fast comparator.

The current source G1 is connected such that current flow therefrom is directed into the junction between the second ends of the resistor R4 and the capacitor C1, thereby producing a positive offset voltage in a resultant signal at the inverting input (−) of the comparator A2 with respect to the buffered input signal 212. The resistor R4 is bypassed at high frequencies by C1. The value of the resistor R4 and the current produced by current source G1 are selected to produce an offset voltage greater than the amount of noise expected in the buffered input signal 212 in order to prevent false triggering when a signal is not present. The gain of the buffer amplifier A1 is selected so that a minimum-amplitude return pulse represented in the buffered input signal will be at least an order of magnitude greater than the offset voltage.

Since the steady-state offset voltage at the inverting input (−) of the comparator A2 is positive with respect to the steady-state voltage at the non-inverting input (in the absence of any signal), the output of comparator A2 is normally in a "low" or in a negative output state. The input signal 202, is buffered and amplified by the buffer section 210 to produce a corresponding amplified pulse signal as the buffered input signal 212. A positive offset is added to this signal in the manner described hereinabove, and is presented at the inverting input of the comparator A2. The buffered input signal is also processed by the delay line DL1 to delay it slightly, and is provided to the non-inverting input of the comparator A2.

FIG. 2A is a waveform (timing) diagram illustrating the relationship of signals in the single channel PD of FIG. 2, wherein a solid-line waveform 252 represents the offset, non-delayed signal at the inverting input (−) of the comparator A2. A dashed-line waveform 254 represents the delayed signal at the non-inverting (+) input of the comparator A2. An output waveform 260 represents the signal 204 at the output of the comparator A2.

The buffered input signal (pulse) 212 passes immediately through the R-C circuit comprising R4 and C1, causing the waveform 252 at the inverting input of the comparator A2 to jump up immediately by an amount substantially equal to the magnitude of the pulse. Since initially this causes the inverting input (−) of the comparator A2 to become significantly more positive than the non-inverting input (+) thereof, the output of comparator A2 remains in a "low" state. Even when the delayed version of the pulse begins to "catch up" at the non-inverting input (+) of the comparator A2, the offset voltage between the waveform 252 at the inverting input and the waveform 254 at the non-inverting input (produced by the combination of R4 and G1) maintains the output of the comparator A2 in a "low" state. However, once the pulse signal has "peaked" and begins to fall again, the non-delayed signal at the inverting input of the comparator A2 becomes negative with respect to the non-inverting input, causing a change in state in the output signal 204 from the comparator A2 to a "high" or positive output state. This is illustrated in FIG. 2A at point 256 where the non-delayed waveform 252 at the inverting input of the comparator A2 crosses over and becomes more negative than the delayed waveform 254 at the non-inverting input of the comparator A2, causing a rising edge 262 in the output waveform 260 as the output signal 204 changes from a "low" output state to a "high" output state. When the delayed signal on the non-inverting input "catches up" to the non-delayed signal on the inverting input, the inverting input once again becomes positive with respect to the non-inverting input, once again causing the output of the comparator A2 to revert to a "low" output state, as shown in FIG. 2A at a point 258, producing a falling edge 264 in the output waveform. Preferably, the comparator A2 is a "fast" comparator.

The maximum pulse amplitude that the circuit of FIG. 2 can process correctly is determined by the saturation voltage of the buffer amplifier and/or the maximum common-mode input voltage of the comparator A2, whichever is lower. The minimum pulse amplitude is substantially determined by the offset voltage produced by R4 and G1.

To extend the dynamic range of the pulse discriminator, multiple channels may be included, and OR-ed together (combined) at their outputs. Each channel would be implemented to handle a distinct range of signal levels. To accomplish this, the input signal (e.g., 202) would be attenuated or amplified to create different ranges of signal for each channel. (As used herein, attenuation and amplification are simply two different versions of scaling.)

FIG. 3 is a schematic diagram of a two-channel pulse-discriminator (PD) circuit 300 having expanded dynamic range with respect to the PD circuit 200 of FIG. 2. The two-channel PD circuit is similar to the single channel circuit (200) in that it comprises a buffer section 310 (compare 210) and a first pulse discriminator section 320a (PD1; compare 220), but differs from the PD circuit 200 of FIG. 2 in that the two-channel PD circuit further comprises a second pulse discriminator section 320b (PD2).

Comparable to the buffer section 210, the buffer section 310 receives an input signal 302 ("IN"; compare 202) and produces a buffered input signal 312 (compare 212). The buffer section 310 comprises a buffer amplifier A1 and three resistors R1, R2 and R3. The buffer amplifier A1 has a non-inverting input (+), an inverting input (−) and an output. The input signal 302 connects to the non-inverting input (+) of the buffer amplifier A1. The resistor R1 is connected between the non-inverting input of the buffer amplifier A1 and ground. The resistor R2 is connected between the output and the inverting input (−) of the buffer amplifier A1, and the resistor R3 is connected between the inverting input (−) of the buffer amplifier A1 and ground. The gain of the buffer amplifier A1 is set by the values of resistors R2 and R3. The output of buffer amplifier A1 produces the buffered input signal 312.

The input signal 302 is connected to and passes through a "matching delay" block 330 (DL3) which delays the input signal 302 slightly to produce a delayed input signal 318. Preferably, the delay of the matching delay block 330 is selected to effectively match any circuit delays in the buffer section 310 so that the delayed input signal 318 and the buffered input signal 312 differ only in amplitude, and are not time-shifted from one another.

Comparable to the pulse discriminator section 220, the first pulse discriminator section 320a (PD1) comprises a delay line DL1, a comparator A2, a resistor R4, a capacitor C1 and a current source G1. The comparator A2 has a non-inverting input (+), an inverting input (−) and an output. The delay line has an input connected to the buffered input signal 312 and an output 322a (compare 222) connected to the non-inverting input (+) of the comparator A2. The buffered input signal 312 is also connected to a first end of the resistor R4 and a first end of the capacitor C1. A second end of the resistor R4 is connected to a second end of the capacitor C1, to a current source G1, and to the inverting input (−) of the comparator A2.

The current source G1 is connected such that current flow therefrom is directed into the junction between the second ends of the resistor R4 and the capacitor C1, thereby producing a positive offset voltage in a resultant signal at the inverting input of the comparator A2 with respect to the buffered input signal 312. The resistor R4 is bypassed at high frequencies by C1. The value of the resistor R4 and the current produced by current source G1 are selected to produce an offset voltage greater than the amount of noise expected in the buffered input signal 312 in order to prevent false triggering when a signal is not present. The gain of the buffer amplifier A1 is selected so that when PD1 combined with buffer amplifier 310 saturate, the second pulse discriminator circuit 320b (PD2) is functional above its minimum signal handling level.

Similarly, comparable to the pulse discriminator section 220, the second pulse discriminator section 320b (PD2) comprises a delay line DL2, a comparator A3, a resistor R5 (compare R4), a capacitor C2 (compare C1) and a current source G2 (compare G1). The comparator A3 has a non-inverting input (+), an inverting input (−) and an output. The delay line DL2 has an input connected to the delayed input signal 318 and an output 322b (compare 322a) connected to the non-inverting input (+) of the comparator A2. The delayed input signal 318 is also connected to a first end of the resistor R5 and a first end of the capacitor C2. A second end of the resistor R5 is connected to a second end of the capacitor C2, to a current source G2, and to the inverting input (−) of the comparator A3.

The current source G2 is connected such that current flow therefrom is directed into the junction between the second ends of the resistor R5 and the capacitor C2, thereby producing a positive offset voltage in a resultant signal at the inverting input of the comparator A3 with respect to the delayed input signal 318. The resistor R5 is bypassed at high frequencies by C2. The value of the resistor R5 and the current produced by current source G3 are selected to produce an offset voltage greater than the amount of noise expected in the delayed input signal 318 in order to prevent false triggering when a signal is not present.

The PD1 section 320a receives the buffered input signal 312 and produces a first output signal 304a ("OUTa"). The PD2 section 320b receives the delayed input signal 318 and produces a second output signal 304b ("OUTb"). The two outputs 304a and 304b are combined to form the output 304 of the pulse discriminator 300.

The first output signal 304a and the second output signal 304b are combined in any suitable manner, such as using a diode "OR-ing" circuit comprising D1, D2 and R6 to produce a combined output signal ("OUT") 304 (compare 204). An anode of the diode D1 is connected to the first output signal 304a. An anode of the diode D2 is connected to the second output signal 304b. Cathode ends of diodes D1 and D2 are connected to each other and to a first end of the resistor R6, forming a junction at which the combined output signal 304 appears. A second end of the resistor R6 is connected to ground.

Since the steady-state offset voltage at the inverting inputs (−) of the comparators A2 and A3 are positive with respect to the steady-state voltage at their non-inverting inputs (in the absence of any signal), their respective output signals 304a (OUTa) and 304b (OUTb) are normally (initially) in "low" or negative output states.

FIG. 3A is a waveform (timing) diagram illustrating the relationship between the input signal 302, the two PD output signals 304a and 304b and the combined output signal 304 in the two-channel PD circuit 300 of FIG. 3, wherein a first solid-line waveform 352 represents the offset, non-delayed signal at the inverting input of the comparator A2, a first dashed-line waveform 354 represents the delayed signal at the non-inverting (+) input of the comparator A2, a second solid-line waveform 372 represents the offset, non-delayed signal at the inverting input of the comparator A3, and a second dashed-line waveform 374 represents the delayed signal at the non-inverting (+) input of the comparator A3. An first output waveform 360 represents the output signal 304a of the first PD section 320a, a second output waveform 380 represents the output signal 304b of the second PD section 320b, and a third output waveform 390 represents the combined output signal 304.

Due to the gain of the buffer section 310 (set by resistors R2 and R3), the amplitude of the buffered input signal 312 is greater than that of the delayed input signal 318, thereby effectively making the first pulse discriminator section 320a (PD1) a high-gain or high-sensitivity "channel" and the second pulse discriminator section 320b (PD2) a low-gain or low-sensitivity "channel". This is evident in the waveforms 352, 354, 372 and 372 of FIG. 3A, wherein the waveforms 352 and 354 associated with the first pulse discriminator section 320a are considerably higher in amplitude than the corresponding waveforms 372 and 374 associated with the second pulse discriminator section 320b.

In the high gain channel, when a strong pulse signal appears in the input signal 302, it causes saturation of the buffer amplifier A1, producing in the flat top waveforms 352 and 354 shown in FIG. 3A. This causes the output response shown in output waveform 360. Due to the "clipped" input waveforms 352 and 354 resulting from the saturation of A1, the point 356 where the non-delayed waveform 352 crosses the delayed waveform 354 producing a rising edge 362 in the first output waveform 360 is delayed compared to when the crossing would have occurred for a lower amplitude signal that did not cause saturation of the buffer amplifier A1. This is due primarily to the effective delay of the beginning of trailing edges of the PD1 waveforms (352, 354) due to clipping. At a point 358 when the waveform 354 corresponding to the delayed signal at the non-inverting input to A2 once again becomes more negative then the waveform 352 at the inverting input of A2, a falling edge 364 occurs in the first output waveform 360.

By way of contrast, in the low gain channel, the unamplified, delayed input signal 318 is considerably smaller in amplitude, as shown by the waveforms 372 and 374 associated with the second pulse discriminator section 320b, permitting the second pulse discriminator section 320b to operate in "normal" fashion, similar to that described hereinabove for the pulse discriminator section 220 of FIG. 2. These waveforms are not clipped, since they do not pass through the buffer amplifier A1. At a point 376 when the waveform 372 at the inverting input of the comparator A3 has "peaked" and becomes more negative than the waveform 374 at the non-inverting input of A3, a rising edge 382 is produced in the second output waveform 380. When the delayed waveform 374 at the non-inverting input of A3 "catches up" and becomes more negative than the non-delayed waveform 372 at the inverting input of A3, a falling edge 384 is produced in the second output waveform 380. As a result of the "normal", non-saturated, lower-amplitude signal waveforms 372 and 374 associated with the second PD section 320b, the rising and falling edges 382 and 384 of the second output waveform 380 occur earlier than those of the first output waveform 360, and the pulses in the output waveforms 360 and 380 overlap in time. The combined output waveform 390 results from "OR-ing" the first and second output waveforms 360 and 380 together, with a rising edge 392 and a falling edge 394 of the combined output waveform 390 corresponding to the rising edge 382 of the second output waveform 380 and the falling edge 364 of the first output waveform 362, respectively.

For weak pulse signals, the amplifier A1 boosts the signal such that the first, higher-gain pulse discriminator section 320a can operate "normally". The offset voltage in the second PD section 320b in combination with the weak signal level either prevents the weak signal from producing an output or delays the signal crossing point that causes a state change in its output, permitting the rising edge from the first pulse discriminator section output to dominate. Since it is the leading edge of the combined output that is of greatest significance (since it indicates the point at which a pulse is declared to have been "detected") trailing edge effects are not of great concern.

To minimize errors due to the intrinsic delays in amplifiers or attenuators, a short matching delay line or cable may be added in series with the second PD section 320b to match the delay through the buffer amplifier A1.

Those of ordinary skill in the art will immediately understand that additional PD sections 320'x' could be employed to further extend the dynamic range of the pulse discriminator circuit 300. Each additional PD section would be preceded by an amplifier or attenuator (gain factor) selected to optimize that PD section for detection a particular range of pulse amplitudes. All of the PD section outputs would be "OR-ed" together as described above.

To improve the accuracy of the pulse discriminator for very low-level signals (i.e., those near the noise level) and to reduce the incidence of "false alarms" (incorrectly producing output pulses when only noise is present at the input), a separate detection threshold can be used to "gate" the comparator (e.g., A2, A3 in FIGS. 2, 3). In effect, this "squelches" the output of the pulse discriminator by disabling the comparator when the signal level is below a preset minimum level, thereby preventing output pulses from being generated.

FIG. 4 is a schematic diagram of a single-channel pulse discriminator circuit 400 (compare 200) that employs a separate threshold circuit 430 to gate a comparator A2 of a pulse discriminator section 420 (compare 220). Similar to the single-channel pulse discriminator of FIG. 2, the pulse discriminator circuit 400 comprises a buffer section 410 and a pulse discriminator section 420. The pulse discriminator circuit 400 additionally comprises a threshold comparator section 430 that provides a gating signal to "squelch" the pulse discriminator section 420.

The buffer section 410 receives an input signal 402 ("IN") and produces a buffered input signal 412. The PD section 420 receives the buffered input signal 412 and produces an output signal 404 ("OUT"). The buffer section comprises a buffer amplifier A1 and three resistors R1, R2 and R3. The buffer amplifier A1 has a non-inverting input (+), an inverting input (−) and an output. The input signal 402 connects to the non-inverting input (+) of the buffer amplifier A1. The resistor R1 is connected between the non-inverting input of the buffer amplifier A1 and ground. The resistor R2 is connected between the output and the inverting input (−) of the buffer amplifier A1, and the resistor R3 is connected between the inverting input (−) of the buffer amplifier A1 and ground. The gain of the buffer amplifier A1 is set by the values of resistors R2 and R3. The output of buffer amplifier A1 produces the buffered input signal 412.

Comparable to the pulse discriminator section 210 of FIG. 2, the pulse discriminator (PD) section 410 comprises a delay line DL1, a comparator A2, a resistor R4, a capacitor C1 and a current source G1. The comparator A2 has a non-inverting input (+), an inverting input (−), a gate input, and an output. The gate input of the comparator A2 acts as an enable signal to the comparator, permitting the comparator to function normally when the gate input is "high" or "active" and forcing the output of the comparator to a "low" state when the gate input is "low" or inactive. The delay line DL1 has an input connected to the buffered input signal 412 and an output connected to the non-inverting input (+) of the comparator A2. The buffered input signal 412 is also connected to a first end of the resistor R4 and a first end of the capacitor C1. A second end of the resistor R4 is connected to a second end of the capacitor C1, to a current source G1, and to the inverting input (−) of the comparator A2.

The threshold section 430 ("THRESHOLD CKT") comprises a comparator A4, a delay line DL4 ("MATCHING DELAY") and a reference voltage source VREF1. The comparator A4 receives the buffered input signal 412 at a non-inverting input thereof, receives an output of the reference voltage source VREF1 at an inverting input thereof, and produces a comparison output signal 428 at an output thereof. The comparison output signal 428 is delayed by the delay line DL4 to produce a delayed comparison output 429, which is connected to the gate or enable input of A2 in the pulse discriminator section 420.

Operation of the pulse discriminator circuit 400 is essentially identical to that of the single-channel pulse discriminator circuit 200 of FIG. 2, except that whenever the buffered input signal 412 (compare 212) is less than the reference voltage (VREF1), the comparator A4 produces a low-level or inactive output, and the comparator A2 of the pulse discriminator section 420 is disabled and held low. Whenever the buffered input signal 412 is greater than the reference voltage, the comparator A2 is enabled. Because of this independent threshold, the false alarm rate (FAR) is more easily controlled. The offset associated with comparator A2 may be reduced (as it does not have to act as a noise threshold) and consequently the timing of small signals near the noise level is more accurate.

This "gated" mode of operation is illustrated in FIG. 4A. FIG. 4A is a waveform (timing) diagram showing the response of the pulse discriminator circuit 400 of FIG. 4 to a noisy pulse input (an input pulse combined with a noise component—pulse+noise). A dashed line 450 represents a threshold voltage level equal to VREF1 above which the threshold comparator A4 will produce a high-level or active comparison output signal 428. A waveform 452 (solid line) is representative of a pulse+noise+offset signal at the inverting input of the PD comparator A2. A delayed waveform 454 (dotted line) is representative of a delayed pulse+noise signal at the non-inverting input of the PD comparator A2. A gate waveform 460 is representative of the gate output signal 428 from the threshold comparator A4 and an output waveform 470 is representative of the output signal 404 from the PD comparator A2.

At a point 456a when the buffered input signal 412 crosses the threshold voltage 450, the gate waveform 460 exhibits a rising edge 462, thereby enabling the PD comparator A2. At a point 458a when the buffered input signal 412 once again falls below the threshold voltage 450, a falling edge 464 appears in the gate waveform 460, once again disabling the PD comparator A2.

The output waveform 470 exhibits a rising edge 472 at a point 456 when the waveform 452 becomes more negative than the delayed waveform 454 while the gate waveform is "high". Ordinarily (i.e., without the gate signal) the output waveform would exhibit a falling edge at the point 458 when the delayed waveform 454 once again falls below the non-delayed waveform 452. At this point, however, the gate signal 460 has already gone inactive, disabling the PD comparator A2, and forcing its output low (inactive) at the point 458a. This is shown in the output waveform 470 as a falling edge 474 concurrent with the falling edge 464 of the gate waveform 460.

Those of ordinary skill in the art will realize that for very weak signals where the pulse signal barely crosses the reference threshold, the gate timing becomes extremely critical and compensating delays may have to be added in the circuit paths to ensure that the gate signal does not disable the PD comparator before the rising edge on the PD comparator output (pulse detection) can occur. Several straightforward ways of dealing with this are to stretch (delay) the trailing edge of the gate signal with a monostable (one shot), a diode-capacitor-resistor network, or with hysteresis (positive feedback) around A4. These techniques are well known to those of ordinary skill in the art and will not be further elaborated upon herein.

The delay lines (DL1, DL2, MATCHING DELAY) may be formed from a length of cable, a transmission line fabricated on a printed board or substrate, a distributed RC or LC network, or any component or group of components capable of creating a delay without significantly distorting the pulse shape.

It will be clear to those skilled in the art that there are many implementations of the circuits described above, without digressing from the spirit and essence of the invention. For example, the comparators may be used with inverting and non-inverting inputs reversed to create an output of opposite polarity, or to handle negative polarity input signals. The offsets may be implemented by different arrangements with the same effect. The threshold detection and gating scheme may be used to detect the weaker signals in the presence of noise, with the addition of lower gain stages, with or without gating to handle the strong signals, as exemplified by the addition of a second pulse discriminator channel (320b) in FIG. 3. Such modifications and adaptations will be immediately understood by those of ordinary skill in the art, and are fully within the spirit and scope of the present invention.

It will also be clear to those skilled in the art that the pulse detector arrangements of the present invention can readily be implemented in a laser rangefinder receiver. Laser rangefinders are well known, and are used to measure distances to targets. Generally, a laser transmitter is used to beam a high intensity pulse of light onto a selected target. The light scattered from (echoed or reflected off of) the target is detected by an optical receiver (or "opto-receiver") which is normally located in close proximity to the laser transmitter. By measuring the transit time (time-of-flight) between a transmitted laser pulse and the received echo, the range (distance) to the target can be determined using a time-interval counter. For example, as shown in FIG. 5, a photoconductive detector PD1 acts as the signal source for an optical receiver, and is positioned such that an incident light beam falling upon an active area of the photoconductive detector will induce a signal current. Low-intensity levels of incident light on the photoconductive detector induce a small signal current, and larger intensity levels of incident light induce a larger signal current. For purposes of understanding the present invention, the photoconductive detector may be assumed to respond instantaneously and linearly to incident light. The incident light can be the transmitted beam, as well as the return pulse. The signal from the photoconductive detector may be received and amplified by a preamplifier A5 to produce a preamplifier output signal. In order to eliminate low-frequency backscatter or clutter, the preamplifier output signal may be processed by (passed through) a high-pass element, such as a high-pass filter (comprising a capacitor C3 and a resistor R7) or a differentiator. The output of the high-pass element may be buffered by a buffer amplifier A6. The buffered high-pass filtered signal may then serve as the input signal ("IN") described hereinabove.

Although the invention has been illustrated and described in detail in the drawings and foregoing description, the same is to be considered as illustrative and not restrictive in character—it being understood that only preferred embodiments have been shown and described, and that all changes and modifications that come within the spirit of the invention are desired to be protected. Undoubtedly, many other "variations" on the "themes" set forth hereinabove will occur to one having ordinary skill in the art to which the present invention most nearly pertains, and such variations are intended to be within the scope of the invention, as disclosed herein.

It should be understood that the invention may be applied to other pulse timing applications and is not limited solely to laser rangefinders The invention may be advantageously applied, for example, to detection of pulses in nuclear or ultrasound aplications.

What is claimed is:

1. A pulse discriminator having an input and an output, comprising:
    a first delay line, a first resistor, a first capacitor, a first adjustable current source, and a first comparator having two inputs and an output;
    wherein:
        an input signal is provided to the input of the first delay line;
        the output of the first delay line is connected to a first input of the first comparator;
        the first resistor is connected in parallel across the first capacitor, and is connected between the input of the first delay line and a second input of the first comparator; and
        the adjustable current source is connected to the second input of the first comparator; and
        the output of the first comparator is the output of the pulse discriminator.

2. A pulse discriminator, according to claim 1, wherein:
    the first input of the first comparator is a non-inverting input; and
    the second input of the first comparator is an inverting input.

3. A pulse discriminator, according to claim 1, wherein the input signal is provided to the first delay line by a buffer amplifier receiving a raw input signal and outputting a scaled input signal.

4. A pulse discriminator, according to claim 1, further comprising:
    a second delay line, a second resistor, a second capacitor, a second adjustable current source, and a second comparator having two inputs and an output;
    wherein:
        the input signal is provided to the input of the second delay line;
        the output of the second delay line is connected to a first input of the second comparator;
        the second resistor is connected in parallel across the second capacitor, and is connected between the input of the second delay line and a second input of the second comparator; and
        the second adjustable current source is connected to the second input of the second comparator.

5. A pulse discriminator, according to claim 4, wherein:
    the output of the first comparator is combined with the output of the second comparator to form the output of the discriminator.

6. A pulse discriminator, according to claim 4, wherein:
    the first input of the first comparator is a non-inverting input; and
    the second input of the first comparator is an inverting input.

7. A pulse discriminator, according to claim 4, wherein the input signal is provided to the first delay line by a buffer section receiving a raw input signal and outputting a scaled input signal.

8. A pulse discriminator, according to claim 7, wherein the raw input signal is provided to the second delay line.

9. A pulse discriminator, according to claim 7, wherein the input signal is provided to the second delay line through a delay circuit to produce a delayed input signal which matches a delay imposed on the raw signal by the buffer section.

10. A pulse discriminator, according to claim 1, further comprising:
    an amplifier receiving the input signal and a voltage reference, and providing an output which gates the first comparator.

11. A pulse discriminator, according to claim 10, further comprising:
    a matching delay circuit interposed between the output of the amplifier and the first comparator.

12. A pulse discriminator, according to claim 10, wherein the input signal is provided to the first delay line by a buffer amplifier receiving a raw input signal and outputting a scaled input signal.

13. A laser rangefinder receiver, comprising means for producing a pulse signal in response to a return and means for detecting the pulse signal, said means for detecting the pulse signal comprising a pulse discriminator, said pulse discriminator comprising:
    a first delay line, a first resistor, a first capacitor, a first adjustable current source, and a first comparator having two inputs and an output;
    wherein:
        an input signal is provided to the input of the first delay line;
        the output of the first delay line is connected to a first input of the first comparator;
        the first resistor is connected in parallel across the first capacitor, and is connected between the input of the first delay line and a second input of the first comparator; and
        the adjustable current source is connected to the second input of the first comparator; and
        the output of the first comparator is the output of the pulse discriminator.

14. A laser rangefinder receiver, according to claim 13, wherein:
    the input signal is provided to the first delay line by a buffer amplifier receiving a raw input signal and outputting a scaled input signal.

15. A laser rangefinder receiver, according to claim 13, further comprising:
    a second delay line, a second resistor, a second capacitor, a second adjustable current source, and a second comparator having two inputs and an output;
    wherein:

the input signal is provided to the input of the second delay line;

the output of the second delay line is connected to a first input of the second comparator;

the second resistor is connected in parallel across the second capacitor, and is connected between the input of the second delay line and a second input of the second comparator; and the second adjustable current source is connected to the second input of the second comparator.

16. A laser rangefinder receiver, according to claim 13, further comprising:

an amplifier receiving the input signal and a voltage reference, and providing an output which gates the first comparator.

17. A method of detecting a pulse signal on a pulse signal source comprising:

providing a pulse signal source;

delaying said pulse signal source by a delay time $t_0$ to produce a delay signal; and comparing said delay signal to said pulse signal source and producing an active output signal level at a comparison output when said delay signal is greater in magnitude by at least a predetermined offset amount than said pulse signal source and otherwise producing an inactive output signal level at the comparison output.

18. Method according to claim 17, further comprising:

multiplying said pulse signal source by at least one predetermined gain factor to produce at least one scaled pulse signal source; and for each scaled pulse signal source:

delaying said pulse signal source by a delay time $t_0$ produce a scaled delay signal;

comparing said scaled delay signal to said scaled pulse signal source and producing an active output signal level at a unique comparison output when said scaled delay signal is greater in magnitude by at least a predetermined offset amount than said scaled pulse signal source and otherwise producing an inactive output signal level at said unique comparison output otherwise; and producing an active output signal level at a combined comparison output when and active output signal level is present at any comparison output, and otherwise producing an inactive output signal level at the combined comparison output otherwise.

19. Method according to claim 17, further comprising:

comparing said pulse signal source to a predetermined threshold level and producing an active signal level at a gating output when said pulse signal is greater in magnitude than the threshold level and producing an inactive signal level at the gating output otherwise;

producing a discriminator output signal that is equivalent to the comparison output when an active signal is present at the gating output and otherwise producing an inactive discriminator output signal.

\* \* \* \* \*